(12) United States Patent
Yon et al.

(10) Patent No.: US 10,732,050 B2
(45) Date of Patent: Aug. 4, 2020

(54) STRUCTURE FOR DETECTING ELECTROMAGNETIC RADIATION OF THE BOLOMETER TYPE AND METHOD FOR MANUFACTURING SUCH A STRUCTURE

(71) Applicant: COMMISSARIAT A L'ENERGIE ATOMIQUE ET AUX ENERGIES ALTERNATIVES, Paris (FR)

(72) Inventors: Jean-Jacques Yon, Sassenage (FR); Etienne Fuxa, Pommiers (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/334,109

(22) PCT Filed: Sep. 19, 2017

(86) PCT No.: PCT/FR2017/052501
§ 371 (c)(1),
(2) Date: Mar. 18, 2019

(87) PCT Pub. No.: WO2018/055276
PCT Pub. Date: Mar. 29, 2018

(65) Prior Publication Data
US 2019/0271598 A1    Sep. 5, 2019

(30) Foreign Application Priority Data

Sep. 22, 2016   (FR) ...................................... 16 58921

(51) Int. Cl.
*G01J 5/08*      (2006.01)
*G01J 5/02*      (2006.01)
(Continued)

(52) U.S. Cl.
CPC ............ *G01J 5/0853* (2013.01); *G01J 5/024* (2013.01); *G01J 5/20* (2013.01); *G01J 5/24* (2013.01);
(Continued)

(58) Field of Classification Search
None
See application file for complete search history.

(56) References Cited

U.S. PATENT DOCUMENTS

| 7,489,024 B2 | 2/2009 | Socher et al. |
| 2010/0244029 A1 | 9/2010 | Yamazaki et al. |

(Continued)

FOREIGN PATENT DOCUMENTS

| DE | 30 01 899 A1 | 7/1981 |
| DE | 10 2014 221 609 A1 | 4/2016 |

(Continued)

OTHER PUBLICATIONS

U.S. Appl. No. 15/968,863, filed May 2, 2018, US 2018/0331155 A1, Leduc, P. et al.

(Continued)

*Primary Examiner* — Yara B Green
(74) *Attorney, Agent, or Firm* — Oblon, McClelland, Maier & Neustadt, L.L.P.

(57) ABSTRACT

A bolometer type detection structure for detecting electromagnetic radiation is provided, including a MOSFET transistor associated with a first absorbing element in order to detect an increase in temperature of the first absorbing element during absorption of the electromagnetic radiation, the transistor including at least one first and at least one second zones, at least one third zone separating the first and second zones from each other, and at least one first gate electrode arranged to bias the third zone, the first gate (Continued)

electrode including at least one first metal portion forming the first absorbing element, the first metal portion having a thickness $E_p$ satisfying:

$$150 \, \Omega \leq \frac{\rho}{E_p} \leq 700 \, \Omega,$$

where $\rho$ is a resistivity of a metal material forming the at least one first metal portion. A process for manufacturing the structure is also provided.

17 Claims, 7 Drawing Sheets

(51) Int. Cl.
| | |
|---|---|
| *G01J 5/24* | (2006.01) |
| *H01L 31/028* | (2006.01) |
| *H01L 31/113* | (2006.01) |
| *H01L 31/18* | (2006.01) |
| *G01J 5/20* | (2006.01) |

(52) U.S. Cl.
CPC ........ *H01L 31/028* (2013.01); *H01L 31/1136* (2013.01); *H01L 31/1804* (2013.01)

(56) References Cited

U.S. PATENT DOCUMENTS

| | | |
|---|---|---|
| 2013/0248686 A1* | 9/2013 | Tohyama .............. H01L 27/146 250/208.1 |
| 2015/0115160 A1 | 4/2015 | O'Brien et al. |
| 2015/0153236 A1 | 6/2015 | Yagami |
| 2015/0214379 A1 | 7/2015 | Yamazaki et al. |
| 2016/0079306 A1 | 3/2016 | Kropelnicki et al. |

FOREIGN PATENT DOCUMENTS

| | | |
|---|---|---|
| EP | 2 995 916 A1 | 3/2016 |
| WO | WO 2015/059227 A1 | 4/2015 |

OTHER PUBLICATIONS

International Search Report dated Jan. 24, 2018, in PCT/FR2017/052501 filed on Sep. 19, 2017.
Preliminary French Search Report dated Jul. 13, 2017, in FR 16 58921 filed on Sep. 22, 2016.
Gitelman, L. et al., "CMOS-SOI-MEMS Transistor for Uncooled IR Imaging", IEEE Transactions on Electron Devices, Sep. 2009, vol. 56, No. 9, pp. 1935-1942.

* cited by examiner

STRUCTURE FOR DETECTING ELECTROMAGNETIC RADIATION OF THE BOLOMETER TYPE AND METHOD FOR MANUFACTURING SUCH A STRUCTURE

TECHNICAL FIELD

The invention relates to the field of optoelectronics and the detection of electromagnetic radiation.

The subject matter of the invention is thus more precisely a structure for detecting electromagnetic radiation of the bolometer type and a method for manufacturing such a structure.

PRIOR ART

In order to detect electromagnetic radiation, in particular in the infrared wavelength range, using structures for detecting electromagnetic radiation of the bolometer type is known.

Such a structure comprises:
- an absorbent element configured to absorb the electromagnetic radiation, generally provided in the form of a suspended membrane,
- a transducer having a characteristic that varies with temperature, the transducer being associated with the absorbent element in order to afford a detection of the rise in temperature of said absorbent element when electromagnetic radiation is absorbed.

Conventionally, the transducer is implemented by a layer having thermistance properties, such as a layer of a metal oxide chosen from the group comprising vanadium oxides $VO_x$, nickel oxides $NiO_x$, titanium oxides $TiO_x$ or a layer of amorphous silicon aSi.

Nevertheless, with such a transducer and with such a configuration, such structures cannot be integrated in the form of a matrix in a component having an array pitch of less than 10 μm. This is because, in order to preserve acceptable sensitivity, the surface of the absorbent element must be sufficient by reason of the limited sensitivity of the layers of metal oxide used as a transducer, the temperature coefficient not exceeding 2 to 2.5%·K$^{-1}$ with such layers.

In order to provide detection structures of the bolometer type having sensitivity compatible with integration in components having an array pitch of less than 10 μm, several methods have been envisaged.

Among these, mention can be made in particular of the possibility taught by the document U.S. Pat. No. 7,489,024, which proposes replacing the transducer with a MOSFET transistor functioning in low inversion mode. This is because such replacement makes it possible to achieve a temperature coefficient that may range up to 10%·K$^{-1}$. Nevertheless, the use proposed in the document U.S. Pat. No. 7,489,024 has, despite an optimised temperature coefficient, a large number of drawbacks that make this type of structure incompatible with integration in components having an array pitch of less than 10 μm.

Through its design, the structure described in the document U.S. Pat. No. 7,489,024 uses layers produced from silicon dioxide as an absorbent element. These layers, because of their function, must have a significant thickness. The result therefore is high thermal inertia and therefore a degraded response time. In addition, these layers are provided at the same level of insulating arms that isolate the structure from the rest of the component that it equips. Such close proximity causes loss, to the rest of the component, of some of the heat generated by the absorption of the electromagnetic radiation.

For these reasons, in order to preserve acceptable sensitivity, the work of the inventors of the structure described in U.S. Pat. No. 7,489,024, published in particular in the scientific journal "IEEE Translation on Electron Devices" volume 56 number 9 pages 1935 to 1942 in 2009, did not make it possible to obtain structures the sizing of which is compatible with integration in the form of a matrix in a component having an array pitch of less than 10 μm. This is because the minimum surface area required for such a structure is 45 μm by 46 μm.

DISCLOSURE OF THE INVENTION

The object of the invention is to remedy this drawback and thus has as its subject matter providing a structure of the bolometer type able to be integrated in the form of a matrix in a component having an array pitch of less than 10 μm.

To this end the invention relates to a detection structure of the bolometer type for detecting electromagnetic radiation, the detection structure comprising:
- at least one first absorbent element configured to absorb the electromagnetic radiation,
- a MOSFET transistor associated with the first absorbent element in order to detect the rise in temperature of said absorbent element when electromagnetic radiation is absorbed, the transistor comprising:
  - at least one first and at least one second zone with a first type of conductivity,
  - at least one third zone separating the first and second zones from one another, the third zone being of a conductivity type chosen from the group comprising a second type of conductivity opposite to the first type of conductivity and a type of conductivity in which the third zone is substantially void of carriers,
  - at least one first gate electrode arranged to bias the third zone.

The first gate electrode comprises at least one first metal portion forming the first absorbent element, said first metal portion having a thickness Ep satisfying the following inequalities:

$$150 \, \Omega \leq \frac{\rho}{Ep} \leq 700 \, \Omega$$

with ρ the resistivity of the metal material forming said metal portion.

With such a provision of the absorbent element in the form of a portion of the first metal gate electrode, the functioning of the structure is optimised thereby. Indeed, because of these inequalities, the first metal portion has an impedance close to that of vacuum, which is around 377Ω, for relatively small thicknesses of around 10 nm. The absorbent element therefore does not need to have a high thickness in order to obtain absorption greater than 85%. Thus, compared with the prior art, the necessary mass of the absorbent element and the inertia thereof are reduced significantly. Thus the structure has low inertia and optimised sensitivity compared with the structures of the prior art. This sensitivity is thus particularly suited to integration of the structure in the form of a matrix in a component having an array pitch of less than 10 μm.

Advantageously the thickness of the first metal portion satisfies the following inequalities:

$$170\,\Omega \le \frac{\rho}{Ep} \le 700\,\Omega.$$

In this way it is possible to obtain absorption greater than 90%.

Ideally, the thickness of the first metal portion satisfies the following inequalities:

$$320\,\Omega \le \frac{\rho}{Ep} \le 420\,\Omega\,\frac{\rho}{Ep}$$

can be substantially equal to 377Ω, that is to say between 360Ω and 380Ω.

It should be noted that such a configuration can in particular be obtained with a metal portion of titanium nitride TiN 10 nm thick.

It should be noted that, with a third zone separating the first zone and the second zone from one another, the third zone is interposed between the first and second zone.

Type of conductivity in which the third zone is substantially void of carriers should be taken to mean, above and in the rest of this document, that the third zone has a type of conductivity and a thickness such that, in the absence of biasing of the detection structure, the third zone is substantially void of carriers. Naturally, in operation and when biasing is applied to the gate electrode, creation of the conduction channel makes it possible to populate the third zone with carriers of the first type of conductivity. It should be noted that, for a person skilled in the art, the indication according to which "the third zone is depleted" is synonymous with such a type of conductivity in which the third zone is substantially void of carriers.

MOSFET transistor, the terminology generally used by a person skilled in the art, means above and in the rest of the document a field effect transistor of the metal oxide semiconductor type. This is because the abbreviation MOSFET originates in the English terminology "metal oxide semiconductor field effect transistor".

the first metallic portion preferably is made from a metal of the "mid-gap" metal type for the third zone, the first metallic portion preferably being made from a metal chosen from the group comprising titanium nitrides, tantalum nitrides and molybdenum silicides for a third zone produced from silicon, the first metal portion advantageously being produced from a titanium nitride for a third zone produced from silicon.

The inventors discovered that, with such an adaptation of the output work of the first metal portion vis-à-vis the third, the transistor can function with a relative low inversion voltage since source to gate voltages of between 50 mV and 75 mV are accessible while offering high sensitivity of the transistor current to temperature. Thus the Joule effect related to the biasing of the structure remains contained and only slightly disturbs the functioning of the structure.

Hereinabove and in the remainder of the document, "metal of the mid-gap type" means that the metal is chosen so as, in the absence of biasing of the structure, to have its Fermi energy in the forbidden band zone of the third zone and more precisely in the vicinity of the middle of the forbidden band of the third zone, typically at an energy level distant from the middle of the forbidden band in a range lying between −25% and +25% of the gap of the forbidden band. Such a gate configuration is generally known to persons skilled in the art by the English term "mid-gap". Thus, in the case where the third zone is produced from silicon, the "metals of the mid-gap type" comprise in particular titanium nitrides, tantalum nitrides and molybdenum silicides.

The first gate electrode is in short-circuit with one of the first and second zones.

With such a configuration, permitted by the possibility of functioning at low inversion voltage for a metal portion of the first gate electrode produced from a metal of the "mid-gap" type, the structure requires only two conductive tracks to be biased. The electrical, and therefore thermal, conductive tracks between the reading electronics and the transistor are reduced to a minimum. It is therefore possible to provide thermal insulation between the transistor and the reading electronics that is particularly optimised.

The first zone is surrounded by the third zone, the third zone being surrounded by the second zone.

With such a configuration, the first gate electrode has a high ratio of the grille width to the grille length, width and length of the gate electrode having to be considered at it is usual to express them in the formalism describing the functioning of MOSFETs, that is to say in relation to the direction of flow of the current between the first and second zones of the transistor. Such a ratio increases the sensitivity of the current of the transistor to temperature. With such a configuration, such a ratio may further be obtained with a relatively great length of the gate electrode in order to optimise the signal to noise ratio of the structure since the noise is directly related to the surface area of the gate electrode. It should thus be noted that, with such a configuration, it is possible to obtain a length of the first gate electrode greater than 0.5 μm. It should also be noted that, with such a configuration, the first zone of the transistor is limited to a single portion and the second zone of the transistor to another single portion. The gate is therefore de facto a determining factor and the ring shape is that which makes it possible to optimise both its surface area and the ratio of its width to its length in the space imposed by the pixel.

The transistor may further comprise:
  a fourth and fifth zone, the fourth zone being of the first type of conductivity and the fifth zone being of a type of conductivity chosen from the group comprising a second type of conductivity opposite to the first type of conductivity and a type of conductivity in which the third zone is substantially void of carriers,
  a third gate electrode arranged to bias the fifth zone,
  wherein the fifth zone separates the second and fourth zones from one another, and wherein the third gate electrode comprises at least one second metal portion forming a second absorbent element, said second metal portion having a thickness Ep satisfying the following inequality:

$$150\,\Omega \le \frac{\rho}{Ep} \le 700\,\Omega$$

with ρ the resistivity of the metal material forming said second metal portion.

An assembly formed by the third, second and fifth zones can separate the first and fourth zones from one another.

The fifth zone may surround the second zone, the fourth zone surrounding the fifth zone.

The first, third, second, fifth and fourth zones may follow each other in a first direction.

Thus, with such characteristics, the gate surfaces of the first and third gate electrodes being added together, the total gate surface area is particularly great. The signal to noise ratio can therefore, because of this, be particularly optimised for such a structure.

It should be noted that, with a fifth zone separating the second and fourth zones from one another, the third zone is interposed between the second and fourth zones.

The third zone may be of the type of conductivity in which the third zone is substantially void of carriers.

With such a third zone, the parasitic effects related to a floating-potential substrate, such as those related to the Kink effect, are contained, or even absent. It is therefore not necessary to add a connection to bias a channel, that is to say the third zone. The thermal insulation of the transistor is therefore not degraded by such a channel biasing connection.

A reflection surface configured to form a quarter-wave cavity with the first absorbent element may be provided.

In this way, the proportion of the electromagnetic radiation not absorbed by the first absorbent element is reflected by the reflection surface in the direction of the first absorbent element in order to be absorbed therein. This phenomenon is all the more amplified because of the resonance created by the formation of the quarter-wave cavity.

The first gate electrode may be separated from the third zone by first and second electrically insulating layers, one of the first and second electrically insulating layers being produced from silicon dioxide, the other one of the first and second electrically insulating layers being produced from dielectric insulator with a high dielectric constant.

In this way it is possible to provide an insulation thickness between the first gate electrode and the third zone that is relatively small while limiting the contribution of the 1/f noise during the functioning of the transistor.

It must be understood hereinabove and in the remainder of the document that "dielectric insulator with a high dielectric constant" or, according to the English name generally employed by persons skilled in the art, "high-K" dielectric material, means an insulating material the dielectric constant of which is high compared with that of silicon dioxide, which is equal to 3.9. Thus a dielectric material can be considered to be a material with a high dielectric constant if it has a dielectric constant greater than or equal to at least 1.5 times, or even 2 to 3 times, that of silicon dioxide.

The structure may also comprise a reading circuit configured to bias the transistor and to determine, from an operating current of the transistor, a rise in temperature of the absorbent element, the reading circuit and the transistor being separated from one another by at least first and second insulating arms each comprising at least one conductive track for biasing the transistor.

In this way, the thermal contact between the transistor and the reading circuit is reduced to a minimum. The structure therefore has a relatively low thermal inertia and has its sensitivity preserved.

Each of the conductive tracks of the first and second insulating arms may be a metal track forming a third absorbent element and may have a thickness Ep satisfying the following inequality:

$$150 \, \Omega \le \frac{\rho}{Ep} \le 700 \, \Omega$$

with ρ the resistivity of the metal material forming said second metal portion.

In this way, the proportion of the electromagnetic radiation not absorbed by the first absorbent element can be absorbed by the conductive tracks and partly participate in the rise in temperature of the transistor.

The transistor may further comprise a second gate electrode on a face of the transistor that is opposite to the first gate electrode, the second gate electrode comprising at least one metal portion of a fourth absorbent element.

Such a second gate electrode makes it possible to adjust the threshold voltage of the transistor while increasing the surface area of the absorbent element thereof. The signal to noise ratio is therefore improved thereby.

The invention also relates to a method for manufacturing a detection structure comprising the following steps:
provision of at least one first, second and third zone, the first and second zones being of a first type of conductivity, the third zone separating the first and second zones from one another and the third zone being of a conductivity type selected from a group comprising a second conductivity type opposite to the first conductivity type and a conductivity type in which the third zone is substantially void of carriers,
formation of a first gate electrode arranged to bias the third zone so as to form a MOSFET transistor, the first gate electrode comprising at least one first metal portion forming an absorbent element configured to absorb the electromagnetic radiation, and in this way the transistor is associated with the absorbent element in order to detect the rise in temperature of said absorbent element when electromagnetic radiation is absorbed, said first metal portion having a thickness Ep satisfying the following inequality:

$$150 \, \Omega \le \frac{\rho}{Ep} \le 700 \, \Omega$$

with ρ the resistivity of the metal material forming said metal portion.

Such a method makes it possible to provide a structure according to the invention and therefore to benefit from the advantages that are related thereto.

During the step of formation of the first gate electrode, the first metal portion of the first gate electrode is produced from a metal of the "mid-gap" type for the third zone, the first metal portion preferentially being made from a metal chosen from the group comprising titanium nitrides, tantalum nitrides and molybdenum silicides for a third zone produced from silicon, the first metal portion advantageously being produced from a titanium nitride for a third zone produced from silicon.

Thus the structure obtained with such a method benefits from the advantages related to the use of a first metal portion of the "mid-gap" type and therefore allows functioning of the transistor at a low inversion voltage.

The following steps may also be provided:
formation of a reading circuit configured to bias the transistor and to determine, from an operating current of the transistor, a rise in temperature of the absorbent element,
formation of first and second insulating arms, each of the first and second insulating arms comprising at least one conductive track, association together of the transistor, the first and second insulating arms and the reading circuit, so that the reading circuit is electrically connected to the transistor by means of the respective conductive tracks of the first and second insulating arms.

The structure thus fabricated has optimised insulation vis-à-vis the reading circuit, in particular through the use of the first and second insulating arms.

During the step of provision of the reading circuit, a substep of formation of a reflection surface may be provided.

During the step of association together of the transistor, the first and second insulating arms and the reading circuit, the reflection circuit may have an arrangement so as to form, with the titanium nitride portion of the first gate electrode, a quarter-wave cavity.

Thus the structure fabricated benefits from the advantages related to such a reflection surface.

BRIEF DESCRIPTION OF THE DRAWINGS

The present invention will be understood better from a reading of the description of example embodiments, given purely indicatively and in no way limitatively, referring to the accompanying drawings, on which.

Identical, similar or equivalent parts of the various figures bear the same numerical references so as to facilitate the change from one figure to another.

The various parts shown in the figures are not necessarily to a uniform scale, in order to make the figures more legible.

The various possibilities (variants and embodiments) must be understood as not being exclusive of each other and may be combined with each other.

DETAILED DISCLOSURE OF PARTICULAR EMBODIMENTS

Figure 1A:
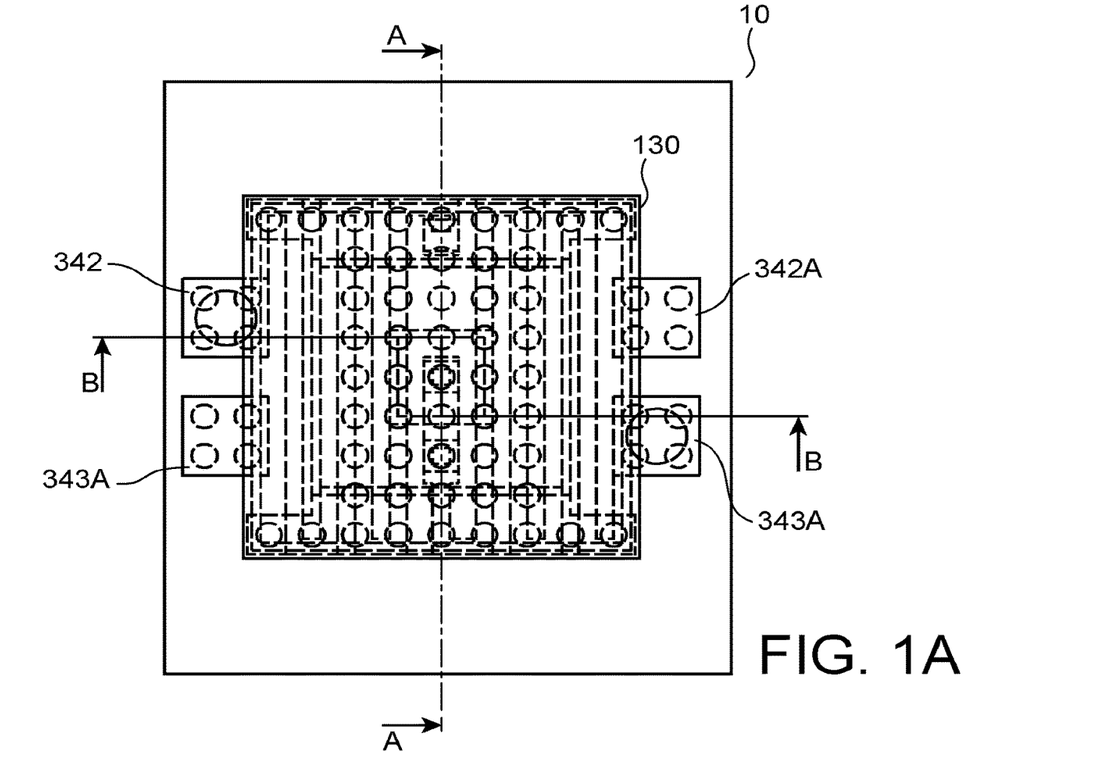
FIGS. 1A to 1C illustrate schematically a structure according to the invention with in FIG. 1A a plan view showing in broken lines the various elements making up the structure, in FIGS. 1B and 1C a view in cross section of the same structure along respectively the axis B-B and the axis A-A.

FIG. 1A illustrates schematically a detection structure 10 of the bolometer type according to the invention, such a detection structure 10 being suitable for detecting electromagnetic radiation.

Such a detection structure 10 relates particularly to the detection of electromagnetic radiation in the infrared wavelength range. Thus the various values indicated in the embodiments described below relate to this practical application, in which the wavelength range sought is the far infrared, that is to say between 8 and 12 µm. Naturally, a person skilled in the art is perfectly able, from the present disclosure, to adapt these values in order to provide, using such a detection structure 10, optimised detection of electromagnetic radiation in a wavelength range other than the infrared.

Figure 1B:
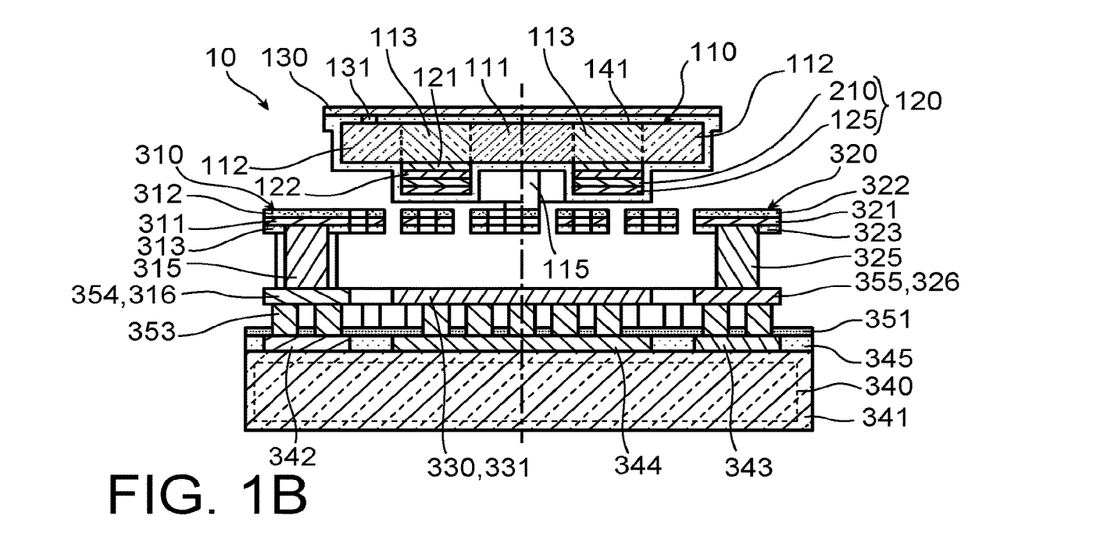
Figure 1C:
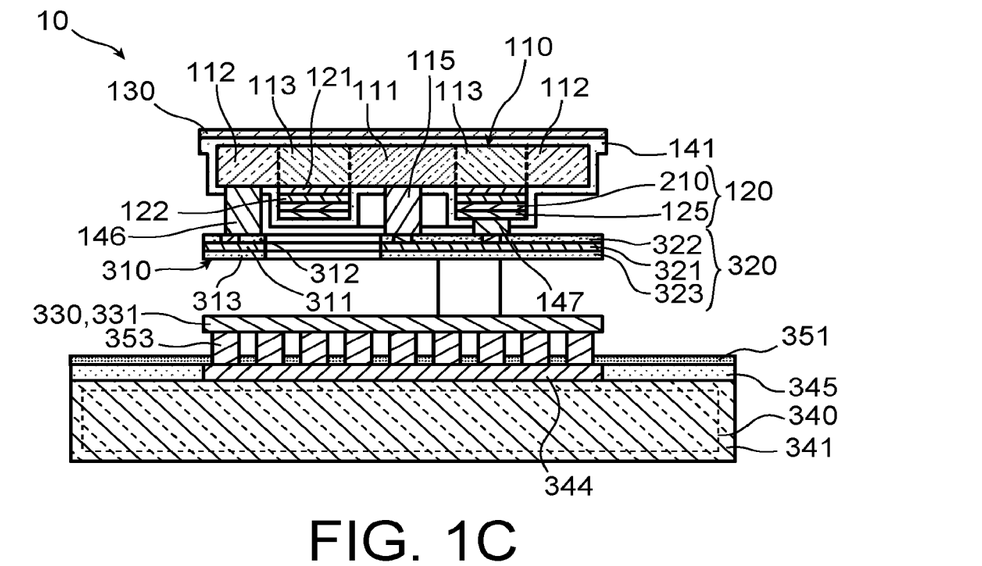

Such a detection structure 10 comprises:
  a MOSFET transistor 100 comprising:
    at least one first and at least one second zone 111, 112 with a first type of conductivity,
    at least one third zone 113 separating the first and second zones 111, 112 from one another, the third zone 113 having a conductivity type in which the third zone is substantially void of carriers, in other words the third zone 113 is completely depleted,
    a first gate electrode 120 arranged to bias the third zone 113, the first gate comprising a first absorption layer 210 made from titanium nitride TiN forming the first absorbent element,
    an optional second gate electrode 130 arranged on the face of the third zone that is opposite to the first gate electrode 120 in order to bias the third zone 113,
  first and second insulating arms 310, 320 comprising respectively a first and second conductive track 311, 321 to enable the transistor 100 to be biased, the first track 311 being connected to the second zone 112, the second track 321 being connected to the first and third zones 111, 113, putting them in short-circuit,
  an optional reflection surface 330, 331 arranged so as to form with the first absorption layer a quarter-wave cavity,
  a reading circuit 340, only the substrate 341 of which is shown, the reading circuit 340 being connected electrically to the first and second conductive tracks 311, 321 by means of respectively first, second, third and fourth bonding pads 354, 355, 316, 326.

It will be noted that, in such a configuration, the first zone 111 forms the drain of the transistor, the second zone 112 forms the source of the transistor and the third zone 113 the channel of the transistor 100. Thus the transistor 100, in this first embodiment, functions in weak insertion, the drain and the gate electrode being in short-circuit and the source-drain $V_{SD}$ and source-gate $V_{SG}$ voltages being equal.

Such a detection structure 10 can be manufactured in four different steps, a first step during which the reading circuit 340 is provided, a second step during which the transistor 100 and its first gate electrode 120 forming the first absorbent element are provided, a third step during which the insulating arms 310, 320 are formed in contact with the transistor 100 and a fourth step during which the assembly consisting of transistor 100 and insulating arms 310, 320 is bonded to the reading circuit 340. During this fourth step, it is also possible to produce the second gate electrode 130.

Figure 2A:
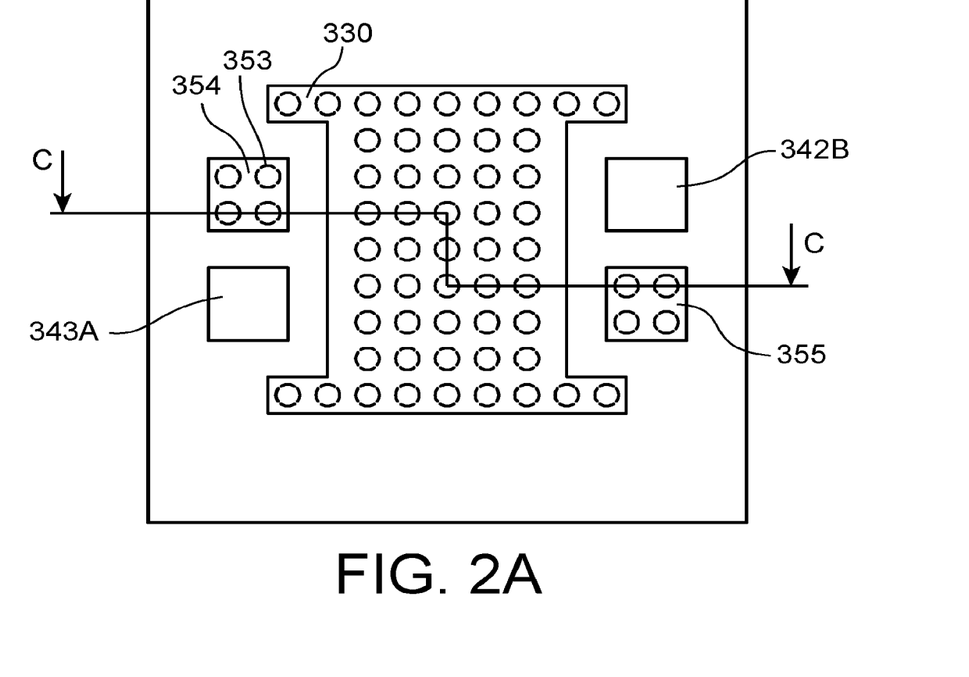
FIGS. 2A and 2B illustrate schematically, during manufacture, the parts of the structure forming respectively a reading circuit and a reflector, with in FIG. 2A a plan view and in FIG. 2B a view in cross section along the axis C-C.
Figure 2B:
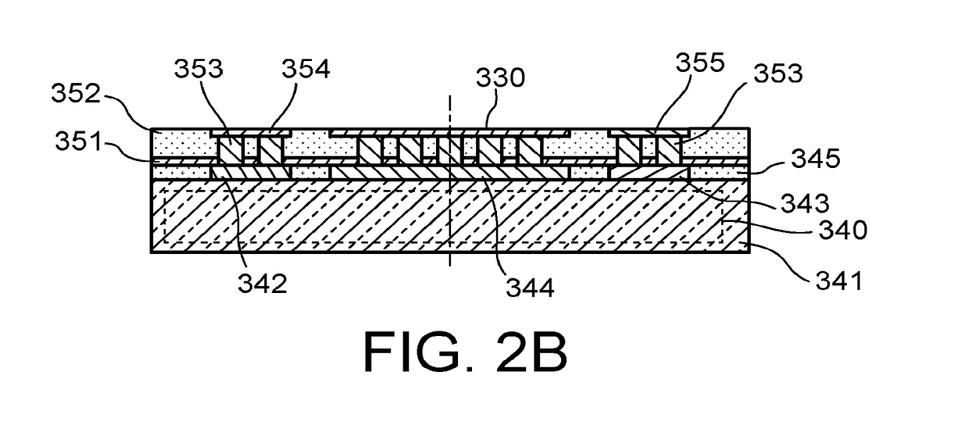

FIGS. 2A and 2B thus illustrate the reading circuit 340 in the course of manufacturing during the step of providing the reading circuit.

Thus the reading circuit 340 is, as illustrated in FIGS. 2A and 2B, provided in a semiconductor support 341, such as a silicon substrate, in which the components of the reading circuit are provided. The reading circuit 340 is configured to bias the transistor and, from an operating current of the transistor 100, to determine a rise in temperature of the first gate electrode 120. Such a reading circuit 340 is solely shown by means of broken lines depicting the location thereof in the support 341. Such a reading circuit 340 is of a type known to persons skilled in the art and can thus just as well be a reading circuit dedicated to a single transistor 100, or a circuit made mutual for a group of or for all the transistors equipping the component 1 (refer to FIG. 5), or a reading circuit composed of a part dedicated to a single transistor and a part made mutual for a group of or for all the transistors equipping a component 1. Such reading circuits, generally in MOS technology, being known to persons skilled in the art, they are not described more precisely in this document.

In order to provide the connection between the reading circuit 340 and the transistor 100, the reading circuit 340 comprises, on a connection face of the semiconductor support 341, first and second connection pads 342, 343. The first and second connection pads 342, 343 are produced from a metal material suitable for forming an ohmic contact with the reading circuit. Thus such a metal material may for example be produced from copper. The first and second connection pads 342, 343, in the context of a practical application of the invention, may have a surface area of 1 μm by 1 μm. It may also be noted that, in FIG. 2A, the first and second connection pads 342B, 343A of respectively a first and second adjacent detection structure are also shown.

The connection face of the semiconductor support 341 is also provided, as illustrated in FIG. 2B, with a metal layer 344 to allow the formation of a first part 330 of the reflection surface 330, 331. Thus the metal layer 344 extends over a major part of the surface of the detection structure 10. It will be noted that, in the practical application of the invention, the surface occupied by the detection structure 10 may be a surface of 5 μm by 5 μm.

The connection face that is not covered by the first and second connection pads 342, 343 and by the metal layer 344 is covered with a first passivation layer 345. It should be noted that, according to one possibility of the invention, such a covering of the connection face may be provided by a Damascene process. The first passivation layer 345 is produced from a dielectric material such as a silicon dioxide $SiO_2$ or a silicon nitride $Si_3N_4$.

and the metal layer 344 are covered with a first stop layer 351. The first stop layer 351 is itself covered with a first sacrificial layer 352. The first sacrificial layer 352 and the first stop layer 351 are produced from materials allowing selective etching, preferentially chemical, of the first sacrificial layer 352, the first stop layer 351 then making it possible to stop the etching in order to protect in particular the first passivation layer 345. Thus, conventionally, the first sacrificial layer 352 may be produced from silicon dioxide $SiO_2$, the first stop layer 351 then being produced from alumina $Al_2O_3$ or aluminium nitride AlN, the selective etching then being obtained by a chemical attack with hydrofluoric acid, preferentially in vapour phase.

The first stop layer 351 and the first sacrificial layer 352 both have passing through them, over their thickness and at the first and second connection pads 342, 343 and the metal layer 344, metal pillars 353 forming, for the first and second connection pads 342, 343, connection vias. The metal material of the metal pillars 353 may be copper. In a practical application of the invention, the metal pillars 353 have a circular cross section, the diameter of which is substantially equal to 0.3 μm. Thus each of the first and second connection pads 342, 343 is in contact with four metal pillars.

The first sacrificial layer 352 also includes:

first and second bonding pads 354, 355 associated respectively with the first and second connection pads 342, 343 by means of the metal pillars 353, the first part 330 of the reflection surface 330, 331 associated with the metal layer 344 by means of the metal pillars 353.

In this way, the first and second bonding pads 354, 355 are connected electrically to respectively the first and second connection pads 342, 343, the first part 330 of the reflection surface 330, 331 being connected mechanically to the metal layer 344 by means of the metal pillars 353.

The first and second bonding pads 354, 355 and the reflective layer 330 are flush with the first sacrificial layer 352 on the face of the first sacrificial layer 352 that is opposite to the first stop layer 351.

In a practical application of the invention, the bonding pads may for example have a surface area of 1 μm by 1 μm.

Thus the step of providing such a reading circuit comprises the following substeps:

provision of the substrate 341 in which the reading circuit 340 was previously produced, formation of the first passivation layer 345, formation of the first and second connection pads 342, 343 and of the metal layer 344, in the thickness of the passivation layer 345, deposition of the first stop layer 351 in contact with the first and second connection pads 342, 343, of the metal layer and of the first passivation layer 345, deposition of the first sacrificial layer 352 in contact with the first stop layer 351, provision of through passages in the first stop layer 251 and in the first sacrificial layer 352, said through passages emerging on the first and second connection pads 342, 343 and the metal layer 344 to allow the formation of the metal pillars 353, provision of surface openings in the first sacrificial layer 352 corresponding to the first and second bonding pads 354, 355 and to the first part 330 of the reflection surface 330, 331, deposition of a metal material in the through passages in order to form the metal pillars 353, the first and second bonding pads 354, 355 and the first part 330 of the reflection surface 330, 331.

It should be noted that it is possible to provide, in order to promote molecular bonding, a substep of planarization of the first sacrificial layer 352, of the first part 330 of the reflection surface 330, 331 and of the first and second bonding pads 354, 355.

Figure 3A:
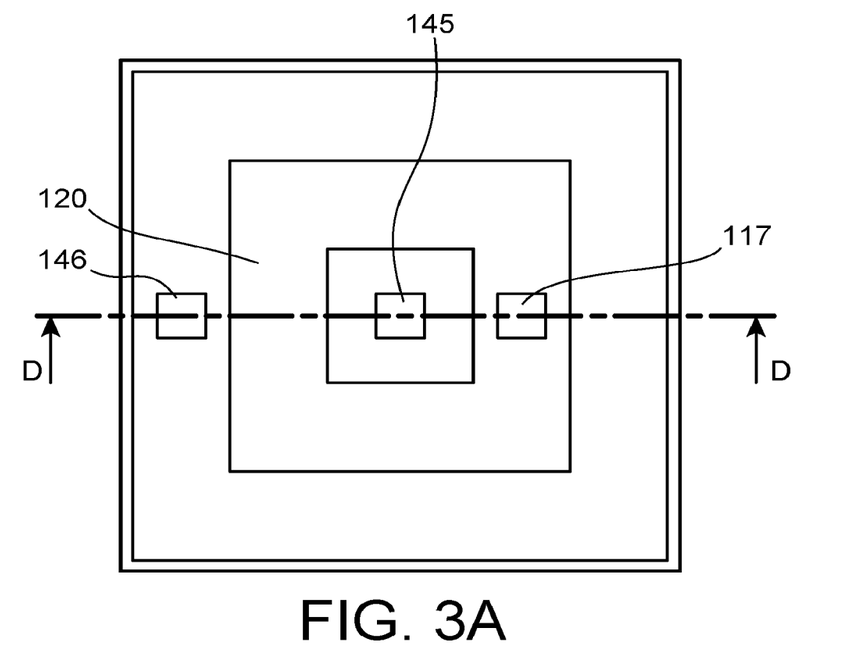
FIGS. 3A and 3B illustrate schematically, during manufacture, the parts of the structure forming respectively an absorbent element and a transducer, with in FIG. 3A a plan view and in FIG. 3B a view in cross section along the axis D-D.
Figure 3B:
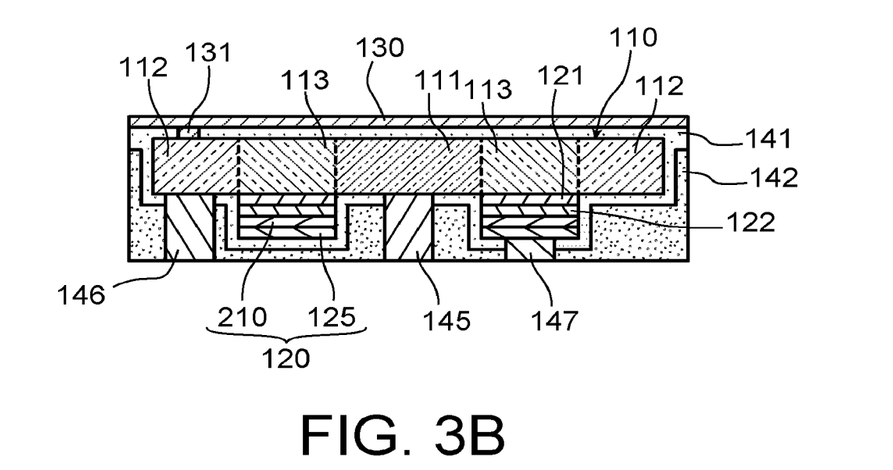

FIGS. 3A and 3B illustrate the transistor 100 in the course of manufacture during the step of providing the transistor 100 and its first gate electrode 120 forming the first absorbent element. It should be noted that, in FIGS. 3A and 3B, the transistor 100 comprises the second gate electrode 130 and a first portion of the second stop layer 141 covering the first, second and third zones 111, 112, 113 on their face that is opposite to the first gate electrode 120. In a preferred variant of the invention, the second gate electrode 130 and the first portion of the second stop layer 141 covering the first, second and third zones 111, 112, 113 may nevertheless be formed subsequently during the step of bonding the assembly consisting of transistor 100 and insulating arms 310, 320 with the reading circuit 340. It should be noted that the first and second zones 111, 112 and the first gate electrode 120 are covered, on the face by means of which they are connected to the first and second conductive tracks 321, by a second portion of the stop layer 141.

It can thus be seen, in FIG. 3A, which illustrates a front view of the transistor 100 on the face by means of which the transistor 100 is to be connected to the reading circuit 340. It can thus be seen that the first, second and third zones 111, 112, 113 of the transistor 100 are concentric, the first zone 111 is surrounded by the third zone 113, the third zone 113 being surrounded by the second zone 112. It can thus be seen in FIG. 3A that the first zone 111 occupies a central square surface, the third zone 113 occupying a hollowed-out square surface of the first zone 111, the second zone occupying the rest of the surface of the transistor 100.

The first, second and third zones 111, 112, 113 are all three formed in a silicon semiconductor layer 110. The first and second zones 111, 112 have a first type of conductivity whereas the third zone 113 is a completely depleted zone. Such depletion of the third zone 113 can be obtained by means of a silicon on oxide substrate, or SOI, standing for the English abbreviation of "silicon on insulator", where the thickness of the silicon on insulator layer has been thinned by thermal oxidation and deoxidation to a thickness of between 15 and 50 nm, preferentially between 25 and 50 nm, or even substantially equal to 50 nm.

Naturally, if such a total depletion of the third zone 113 is advantageous, it can also be envisaged, without departing from the scope of the invention, that the third zone 113 may be of a second conductivity type opposite to the first conductivity type.

The third zone 113 is covered with the first gate electrode 120 and is separated from the latter by first and second electrically insulating layers 121, 122. In order to minimise the operating voltage of the transistor, the first insulating layer 121, in contact with the third zone, is produced from silicon dioxide $SiO_2$ while the second insulating layer 122, in contact with the first insulating layer 121, is produced from a dielectric insulator with a high dielectric constant such as hafnium oxide. It should be noted that, in a practical application of the invention, the first insulating layer 121 may have a thickness of 9 nm, while the second insulating layer 122 produced from hafnium oxide has a thickness of 3 nm.

The first gate electrode 120, in contact with the second insulating layer 122, may comprise the first absorption layer 210 and a first conductive layer 125. The first absorption layer 210 in contact with the second insulating layer 122 is produced from titanium nitride TiN whereas the first conductive layer 125 in contact with the first absorption layer 210 is produced from a material suitable for allowing an ohmic connection between the first gate electrode 120 and the second conductive track 321 of the second insulating arm 320. In a practical application of the invention, the first absorption layer 210 has a thickness of 10 nm, while the first conductive layer 125 is produced from doped polycrystalline silicon Si and has a thickness of 70 nm.

With such a configuration, the first gate electrode 120 forms a so-called "mid-gap" gate electrode. This is because the use of a first absorption layer of titanium nitride TiN in contact with the gate insulating layers makes it possible to obtain a difference in output work between the silicon of the third zone and the metal of the gate electrode such that the threshold voltage of the transistor 100 is low. Thus this configuration allows a functioning of the transistor with a gate/source voltage of between 2 KT/q and 3 KT/q (K being the Bolzmann constant, T the operating temperature of the transistor and q the elementary charge), that is to say between 50 and 75 mV at ambient temperature, that is to say 300 K. In addition, in the case where the thickness of the first absorption layer 210 is substantially equal to 10 nm as is the case in the practical application of the invention, the resistance of the first absorption layer 210 is substantially suited to that of vacuum, that is to say 377 ohms, which assists absorption of electromagnetic radiation by the first absorption layer 210.

In a variant, other gate electrode configurations can be envisaged in the context of the invention. Thus the first gate electrode 120 may comprise, instead of the first titanium nitride absorption layer, a first metal portion forming a first absorbent element, said first metal portion having a thickness Ep satisfying the following inequalities:

$$150 \: \Omega \leq \frac{\rho}{Ep} \leq 700 \: \Omega$$

with ρ the resistivity of the metal material forming said metal portion.

In order to provide absorption of electromagnetic radiation, this same first metal portion can advantageously satisfy the following inequalities:

$$320 \: \Omega \leq \frac{\rho}{Ep} \leq 420 \: \Omega$$

Even more advantageously, $$\frac{\rho}{Ep}$$

can be substantially equal to 377Ω, that is to say between 360Ω and 380Ω.

According to this variant, the metal material of the first metal portion may be a metal of the "mid-gap" type for the third zone 113, the first metal portion preferentially being made from a metal chosen from the group comprising titanium nitrides, tantalum nitrides and molybdenum silicides for a third zone produced from silicon. It should also be noted that, according to a less advantageous possibility of the invention in which the metal material of the first metal portion is not a metal of the "mid-gap" type, the first metal portion may be produced from an aluminium alloy and titanium.

As illustrated in FIG. 3B, the assembly formed by the first, second and third zones 111, 112, 113, the first and second insulating layers 121, 122, the first absorption layer 210 and the conduction layer 125 is surrounded by a second stop layer 141. The second stop layer 141 is itself covered, on its face that covers the first gate electrode 120 and the first and second zones 111, 112, with a second sacrificial layer 142. The second stop layer 141 and the second sacrificial layer both have a first, second and third conductive via 145, 146, 147 passing through them, emerging respectively on the first zone 111, the second zone 112 and the first gate electrode 120. In the same way as the first sacrificial layer 352 and the first stop layer 351, the second sacrificial layer 142 and the second stop layer 141 are produced from materials allowing selective etching, preferentially chemical, of the second sacrificial layer 142, the second stop layer 141 therefore stopping the etching. Thus the second sacrificial layer 142 can be produced from silicon dioxide $SiO_2$, the second stop layer 141 then being produced from alumina $Al_2O_3$ or aluminium nitride AlN.

In order to provide optimised contact between each of the first, second and third conductive vias 145, 146, 147 and the first and second zones 111, 112 and the first gate electrode 120, each of the first, second and third conductive vias 145, 146, 147 comprises a contact portion made from titanium Ti 30 nm thick, an intermediate portion made from titanium nitride TiN 60 nm thick and a longitudinal portion made from tungsten W.

As illustrated in FIG. 3B, the second stop layer 141 may also be covered, on its face opposite to the second sacrificial layer 142, with the second gate electrode 130. According to this possibility, the second stop layer 142 forms an electrical insulator that electrically insulates the second gate electrode from the first, second and third zones 111, 112, 113. As stated above, according to a preferred variant of the invention, the first portion of the second sacrificial layer 142 and the second gate electrode 130 may be formed during the fourth step. Thus the first portion of the second sacrificial layer 142 and the second gate electrode 130 are described more precisely in relation to the fourth step.

Thus the step of providing such a transistor comprises the following substeps:
provision of the substrate of the SOI type, not illustrated, etching and thinning of the substrate in order to provide a completely depleted silicon layer 110,
deposition of the first insulating layer 121, in contact with the layer of silicon,
deposition of the second insulating layer 122, in contact with the first insulating layer 121,
deposition of the first absorption layer 210 in contact with the second insulating layer 122,
deposition of the conductive layer 125 in contact with the first absorption layer 210,
selective etching of the conductive layer 125, of the first absorption layer 210, of the insulating layer 122 and of the first insulating layer 121 so as to form the first gate electrode 120,
implantation of the layer of silicon with doping elements of the first conductivity type in order to form the first and second zones, the first gate electrode making it possible to protect the third zone 113 during the implantation,
deposition of the second stop layer 141,
deposition of at least the second portion of the second sacrificial layer 142,
opening of a first, second and third passage in the second portion of the second stop layer 141 and in the second sacrificial layer 142 corresponding respectively to the first, second and third vias, the first, second and third passages opening respectively in the first and second zones 111, 112 and the first gate electrode 120,
successive deposition in the first, second and third passages of the first contact portion made from titanium Ti, of the intermediate portion made from titanium nitride TiN and of the longitudinal portion made from tungsten W.

In the case where, according to a non-preferred variant of the invention, the first portion of the second stop layer 141 and the third gate electrode are formed during this fourth step, the first portion of the sacrificial layer 142 is formed simultaneously with the second portion of the sacrificial layer 142 during the step of deposition of at least the second portion of the second sacrificial layer 142, and the step of providing such a transistor further comprises the following substeps:
opening of a through passage 131, illustrated in FIG. 1B, in the first portion of the second sacrificial layer 142, said through passage opening out in the second zone 112,
formation of the second gate electrode 130 in contact with the first portion of the second sacrificial layer 142, a conductive via then being formed in the through passage 131 between the second gate electrode 130 and the second zone 112.

Figure 4A:
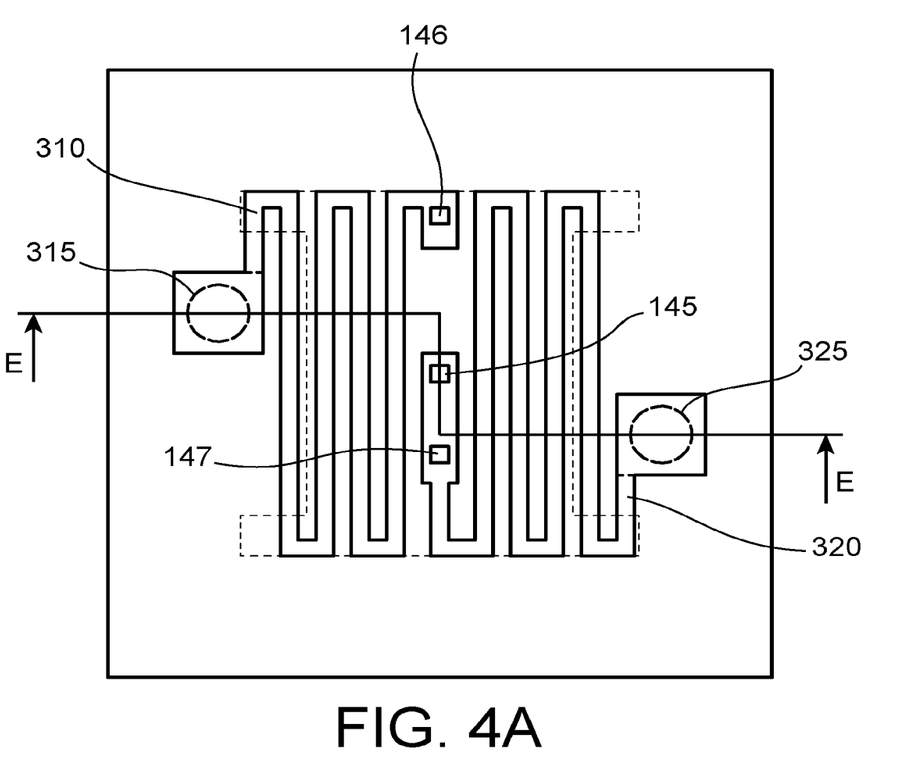
FIGS. 4A and 4B illustrate schematically, during manufacture, the parts of the structure forming respectively insulating arms and the reflector, with in FIG. 4A a plan view and in FIG. 4B a view in cross section along the axis E-E.
Figure 4B:
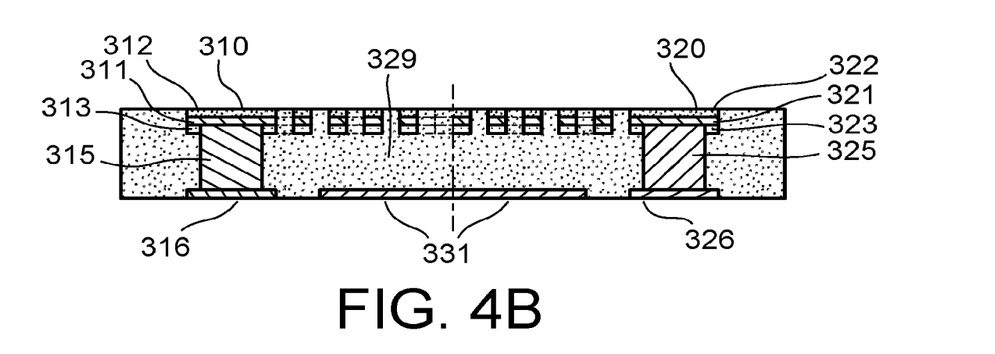

FIGS. 4A and 4B illustrate the insulating arms 310, 320 in the course of manufacture during the step of providing the insulating arms 310, 320. The first and second insulating arms 310, 320 are provided in contact with the second sacrificial layer 142.

Thus the first and second insulating arms 310, 320 each comprise:
a first stiffening layer 312, 322 in contact with the second sacrificial layer 142,
the corresponding conductive track 311, 321 in contact with the first stiffening layer 312, 322 on the face of the first stiffening layer 312, 322 that is opposite to the second sacrificial layer 142,
a second stiffening layer 313, 323 in contact with the corresponding conductive track 311, 321 on the face of the corresponding conductive track 311, 321 that is opposite to the first stiffening layer 312, 322.

The first and second insulating arms 310, 320 are configured to thermally insulate the transistor 100 from the rest of the component 1. Thus, as illustrated in FIG. 4A, the first and second insulating arms 310, 320 have a maximum length with a minimum width and thickness. Thus the first and second insulating arms 310, 320 are each in the form of a coil occupying half of the surface of the structure. In a variant, other configurations of the first and second insulating arms 310, 320 can be envisaged. For example, each of the first and second insulating arms 310, 320 may be in the form of meanders interleaved by abutting perpendicular segments with each other.

The first and second stiffening layers 312, 322, 313, 323 of the first and second insulating arms 310, 320 are produced from a material resistant to the selective attack of the first and second sacrificial layers 352, 142. Thus, in a practical application of the invention, the first and second stiffening layers 312, 322, 313, 323 of the first and second insulating arms 310, 320 can be produced from amorphous silicon, alumina $Al_2O_3$ or aluminium nitride AlN. The first and second stiffening layers 312, 322, 313, 323 of the first and second insulating arms 310, 320 may have a thickness ranging from 10 to 100 nm, preferentially 20 to 60 nm, or even substantially equal to 20 nm, in order to provide sufficient stiffness for supporting the transistor 100.

The first stiffening layer 312 of the first insulating arm 310 has, at the second conductive via 146, a drill in which a first conductor is provided in order to put the first conductive track 311 in electrical contact with the second conductive via 146. In the same way, the first stiffening layer 322 of the second insulating arm 320 has, at the first and third conductive vias 145, 147, two drills in which a first and second conductor are provided in order to put the second conductive track 321 in electrical contact with respectively the first and second conductive vias 145, 147.

It should be noted that, advantageously, the first and second conductors may be formed during the deposition of the first conductive track 311 by filling in the corresponding drills with the metal material forming the conductive track 311.

According to an advantageous possibility of the invention, the first and second conductive tracks 311, 321 may be produced from titanium nitride TiN (typical thickness 10 nm). In this way, the first and second insulating arms 310, 320 form a third absorbent element to the one formed by the first gate electrode 120. In a variant, and in the same way as for the first gate electrode 120, the first and second conductive tracks 311, 321 may be produced from a metal and have a thickness Ep satisfying the following inequalities:

$$150 \, \Omega \leq \frac{\rho}{Ep} \leq 700 \, \Omega$$

with ρ the resistivity of the metal material forming said conductive track 311, 321. In order to provide absorption of the electromagnetic radiation, this same conductive track 311, 321 may advantageously satisfy the following inequalities:

$$320 \, \Omega \leq \frac{\rho}{Ep} \leq 420 \, \Omega$$

Even more advantageously $$\frac{\rho}{Ep}$$

may be substantially equal to 377Ω, that is to say between 360Ω and 380Ω.

The second stiffening layers 313, 323 of the first and second insulating arms 310, 320 comprise a first and second spacing column 315, 325 corresponding respectively to the first and second bonding pads 354, 355 of the reading circuit 340 and in electrical connection with the corresponding conductive track 311, 321. In a practical application of the invention, the first and second spacing columns 315, 325 may for example have a diameter of 0.7 μm.

The first and second spacing columns 315, 325 are extended by respectively a third and fourth bonding pad 316, 326. The third and fourth bonding pads 316, 326 are sized so as to correspond respectively to the first and second bonding pads 354, 355. Thus each of the third and fourth bonding pads 316, 326 may have a surface area of 1 μm by 1 μm.

As illustrated in FIG. 4B, the first and second insulating arms 310, 320 and the first and second spacing columns are included in a third sacrificial layer 329 with the first and second spacing columns 315, 325, which project in the stiffening layer 313, 323. The first and second spacing columns extend with the third and fourth bonding pads 316, 326 over the entire thickness of the third sacrificial layer 329. Thus the third and fourth bonding pads 316, 326 fit flush with the third sacrificial layer 329 on the face of the third sacrificial layer 329 that is opposite to the first and second insulating arms 310, 320.

The third sacrificial layer 329 and the spacing columns 315, 325 are sized so that the reflection surface 330, 331 forms, with the first absorption layer 210, a quarter-wave cavity.

A second part 331 of the reflection surface 330, 331 is also included in the third sacrificial layer 329, fitting flush with the latter, corresponding to the first part 330 of the reflection surface 330, 331.

The third sacrificial layer 329, in order to allow selective etching thereof at the time of etching of the first and second sacrificial layers 352, 142 and molecular bonding between the assembly formed by the third sacrificial layer 329, the second part 331 of the reflection surface 330, 331 and the third and fourth connection pads 316, 326, and the assembly formed by the first sacrificial layer 352, the first part of the reflection surface 330, 331 and the bonding pads 354, 355.

Thus the step of providing insulating arms comprises the following substeps:

deposition of a first full-wafer stiffening layer in contact with the second sacrificial layer 142 on the face of the second sacrificial layer 142 that is opposite to the second stop layer, delimitation, in the first full-wafer stiffening layer, of the drills intended to form the drills of the first stiffening layers 312, 322 of the first and second insulating arms 310, 320, deposition of the first, second and third conductors in the drills, deposition of a full-wafer conductive layer in contact with the first full-wafer stiffening layer on a face of the first stiffening layer that is opposite to the second sacrificial layer 142, deposition of a second full-wafer stiffening layer in contact with the second full-wafer conductive layer on a face of the full-wafer conductive layer that is opposite to the first full-wafer stiffening layer, selective etching of the first full-wafer stiffening layer, of the full-wafer conductive layer and of the second full-wafer stiffening layer so as to form the first and second insulating arms, deposition of the third sacrificial layer 329 so that the first and second insulating arms 310, 320 are included in the third sacrificial layer, provision of a first and second opening in the third sacrificial layer and in respectively the second stiffening layers 313, 323 of the first and second insulating arms 310, 320 to allow the formation of the spacing columns 315, 325 and third and fourth bonding pads 316, 326, provision of a third opening in the third sacrificial layer to allow the formation of a second part 331 of the reflection surface 330, 331, metal deposition in the first, second and third openings of the third sacrificial layer and in the first and second openings of each of the second stiffening layers 313, 323 in order to form the first and second spacing columns, the third and fourth bonding pads and the second part 331 of the reflection surface 330, 331, the third sacrificial layer 329, the second part 331 of the reflection surface 330, 331 and the bonding pads 315, 325 being able to be subjected to a planarization step in order to assist molecular bonding.

The fourth step of bonding of the assembly consisting of transistor 100 and insulating arms 310, 320 with the reading circuit 340 makes it possible to form the detection structure 10 according to the invention. During this step, the assembly formed by the third sacrificial layer 329, the second part 331 of the reflection surface 330, 331 and the third and fourth bonding pads 316, 326 is molecularly bonded to the assembly formed by the first sacrificial layer 352, the first part 330 of the reflection surface 330, 331 and the bonding pads 354, 355 with the first bonding pad 354 put in relationship with the third bonding pad 316 and the second bonding pad 335 put in relationship with the fourth bonding pad 326.

Once the molecular bonding has been carried out and in the context of the preferred variant of the invention in which the second gate electrode was not produced during the second step, additional substeps are provided for forming the first portion of the sacrificial layer 142 and the second gate electrode 130.

According to this variant, the first portion of the sacrificial layer 142 is produced from the same material as that of the second portion of the sacrificial layer 142 formed during the second step. Thus the first portion of the sacrificial layer 142 can be produced from alumina Al$_2$O$_3$ or aluminium nitride AlN. The first portion of the sacrificial layer 142 thus forms an electrical insulator for electrically insulating the second gate electrode from the first, second and third zones 111, 112.

The second gate electrode 130 is advantageously produced from titanium nitride TiN with a thickness substantially equal to 10 nm. According to this possibility, the second gate 130 forms a fourth absorbent element to the one formed by the first gate electrode 120. In the same way as for the first absorption layer 210, the second gate electrode 130 may also be produced from a metal and have a thickness Ep satisfying the following inequalities:

$$150\ \Omega \le \frac{\rho}{Ep} \le 700\ \Omega$$

with ρ the resistivity of the metal material forming said conductive track 311, 321. In order to provide absorption of electromagnetic radiation, this same conducive track 311, 321 may advantageously satisfy the following inequalities:

$$320\ \Omega \le \frac{\rho}{Ep} \le 420\ \Omega$$

Even more advantageously $$\frac{\rho}{Ep}$$

may be substantially equal to 377Ω, that is to say between 360Ω and 380Ω.

In the same way, in the case where the second gate electrode 130 does not fulfil any function of absorption of electromagnetic radiation, the second gate 130 may be produced from another material without departing from the scope of the invention. Thus it can for example be envisaged that such a second gate electrode 130 may be produced from polycrystalline silicon Si. It can also be envisaged that the second gate electrode 130 may be formed from two conductive layers, one of them optionally being made from titanium nitride TiN.

Thus, according to this variant of the invention, the fourth step further comprises the following steps:
 formation of the first portion of the second stop layer 142 in contact with the first, second and third zones 111, 112, 113 on the faces of the latter that are opposed to the first gate electrode 120,
 opening of a through passage 131, illustrated in FIG. 1B, in the first portion of the second sacrificial layer 142, said through passage emerging in the second zone 112, formation of the second gate electrode 130 in contact with the first portion of the second sacrificial layer 142, a conductive via then being formed in the through passage 131 between the second gate electrode 130 and the second zone 112.

Whether in the preferred variant described above or in the variant in which the second gate electrode 120 is provided during the second step, the fourth step further comprises the following substep of
 selective etching of the first, second and third sacrificial layers 352, 142, 329, for example by acid attack, the rest of the detection structure 10 being protected by the first and second stop layers 351, 141.

In this way, the transistor 100 is thermally insulated from the rest of the detection structure 10 by the first and second insulating arms 310, 320.

the substrate, makes it possible in the case where the detection structure 10 equips a component comprising a plurality of detection structures 10A, 1013, 10C, 10D, to thermally insulate the detection structure 10 from the corresponding reading circuit and the detection structures 10A, 10B, 10C, 10D that are indirectly adjacent thereto.

Figure 5:
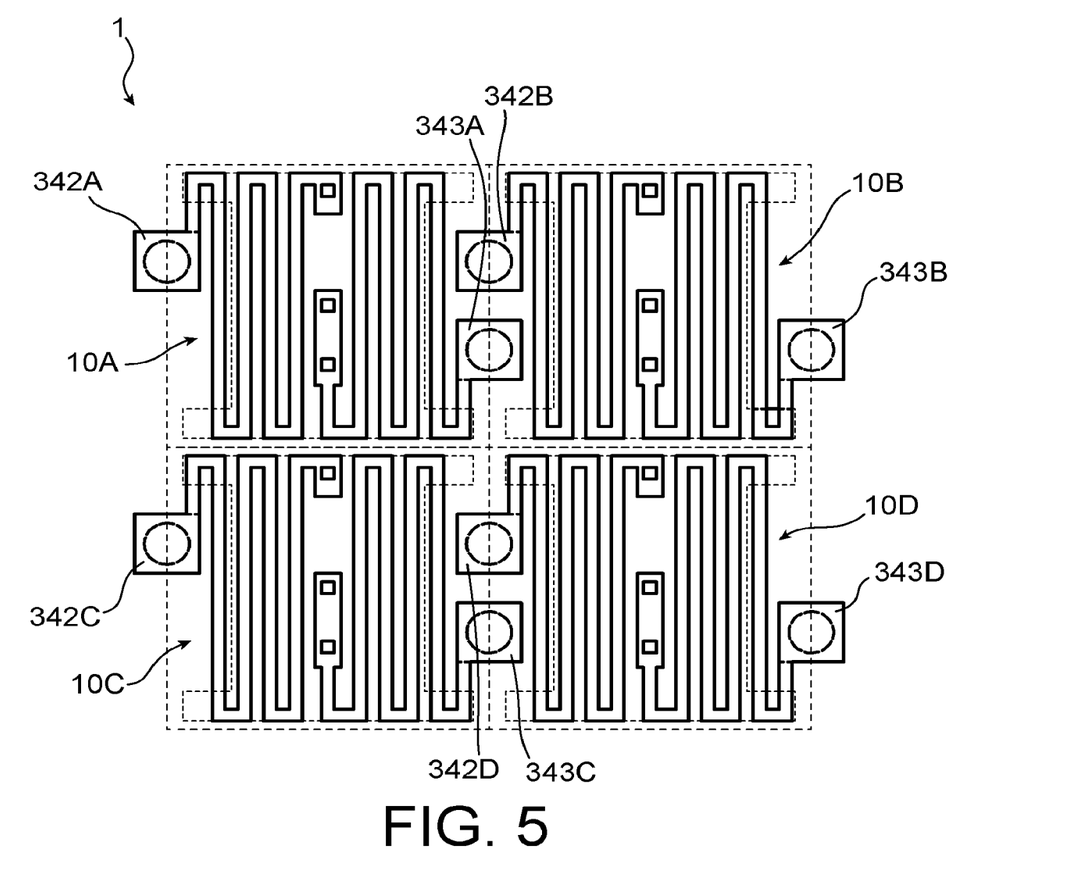
FIG. 5 illustrates schematically the organisation in a matrix of four structures according to the invention when they equip a component.

Thus FIG. 5 illustrates an example of integration of a detection structure 10 according to the invention in such a component 1 comprising a plurality of detection structures 10A, 10B, 10C, 10D organised in the form of a square matrix. It can thus be seen in FIG. 5 that the arrangement of the bonding pads 342, 343 offset therefrom makes it possible to optimise the surface occupied by each of the structures 10A, 10B, 10C, 10D, the first connection pad 342A, 342B, 342C, 342D being adjacent to the second connection pad 343A, 343B, 343C, 343D of the structure 10A, 10B, 10C, 10D that is directly adjacent thereto on the left, the second connection pad 343A, 343B, 343C, 343D being adjacent to the first connection pad 342A, 342B, 342C, 342D of the detection structure 10A, 1013, 10C, 10D that is directly adjacent thereto on the right. With such a configuration, the reception surface, i.e. the surface of the first gate 120, occupies an optimised surface. Such a configuration makes it possible to envisage components having a pitch between two structures 10A, 10B, 10C, 10D of around 5 µm.

Figure 6:
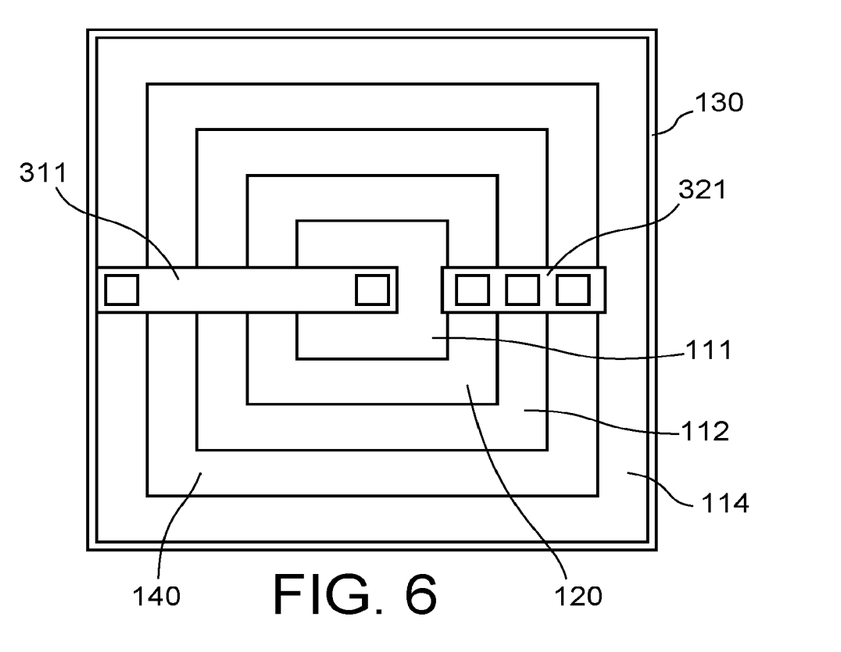
FIG. 6 illustrates schematically in plan view a structure according to a second embodiment in which the transducer comprises five zones.

FIG. 6 illustrates the arrangement of the gate electrode of a detection structure 10 according to a second embodiment of the invention in which the surface of absorption elements is optimised. Such a detection structure 10 is differentiated from a detection structure 10 according to the first embodiment in that the transistor comprises a first, second, third, fourth and fifth zone 111, 112, 113, 114, 115 and a first and third gate electrode 120, 140.

The first, second and third zone 111, 112, 113 and the first gate electrode 120 have a configuration identical to that described in the first embodiment, except that the second zone 112 serves as a drain and it is therefore, because of this, it which is in short-circuit with the first gate electrode 120. Thus the second conductive track 321 makes it possible to bias the second zone 112 and the first gate electrode 120, the first conductive track 311 making it possible to bias the first zone 111.

The fourth zone 114 is a zone of the first type of conductivity, with a configuration similar to that of the first and second zone 111, 112. In a similar fashion to the third zone 113, the fifth zone 115 may be a completely depleted zone. The fifth zone 115 surrounds the second zone 112 and the fourth zone 114 surrounds the fifth zone.

The third gate electrode 140 has a configuration substantially identical to that of the first gate electrode and thus comprises, in the same way as the first gate electrode, a second absorption layer 220.

The second conductive track 321 is configured so as, as illustrated in FIG. 6, to put the first gate electrode 120 in short-circuit with the third gate electrode 130 and with the second zone 112. The second conductive track 312 is configured so as, as illustrated in FIG. 6, to put the first zone 111 in short-circuit with the fourth zone 114. In this way, the structure has two transistors in parallel with one another and has an increased gate electrode surface area and an optimised ratio of the gate width to the gate length.

Naturally, if in the first and second embodiments described above the first gate electrode 120 is put in short-circuit with one of the first and second zones 111, 112, it can also be envisaged, without departing from the scope of the invention, for the first and second zone and the first gate electrode to be biased independently of each other. In such a configuration, it is then necessary to provide a third conductive track provided either in one of the first and second insulating arms or in a third insulating arm. In the same way, in the case where a second gate electrode 130 is provided on the face of the first, second and third zones 111, 112, 113 opposite to the first face if the latter can be biased by means of an electrical connection to the second zone 112, it can also be envisaged, without departing from the scope of the invention, for the second gate electrode 130 to be biased otherwise. In such a configuration, it is necessary to provide a third conductive track provided either in one of the first and second insulating arms or in a third insulating arm.

It should also be noted that if, in the embodiments described above, a second gate electrode 130 is provided, such a second gate 130 is not necessary for the correct functioning of the invention. Thus it can perfectly well be envisaged adjusting the threshold voltage of the transistor by means of charges trapped in one of the first and second electrically insulating layers or to provide independent biasing of the first gate electrode 120.

In the same way, if in the first and second embodiment a reflection surface 330, 331 is provided, it can also be envisaged, without departing from the scope of the invention, for the detection structure 10 not to have one.

It should also be noted that the form of the zones and/or of the gate electrodes described in the context of the first and second embodiment are given only by way of example and is no way limitative. Thus a structure similar to that of the first embodiment can also perfectly well be envisaged in the context of the invention, except that the first, second and third zones follow each other along a first direction. In the same way, a structure similar to that of the second embodiment can also be envisaged except that the first, second and third, fourth and fifth zones follow each other along a first direction.

The invention claimed is:

1. A bolometer type detection structure for detecting electromagnetic radiation, the detection structure comprising:
   at least one first absorbent element configured to absorb electromagnetic radiation; and
   a MOSFET transistor associated with the at least one first absorbent element and being configured to detect a rise in temperature of the at least one first absorbent element when the electromagnetic radiation is absorbed, the MOSFET transistor comprising:
      at least one first zone and at least one second zone with a first type of conductivity,
      at least one third zone separating the at least one first zone and the at least one second zone from one another, the at least one third zone being of a conductivity type chosen from among a group comprising a second type of conductivity opposite to the first type of conductivity and a type of conductivity in which the at least one third zone is substantially void of carriers,
      at least one first gate electrode arranged to bias the at least one third zone,
   wherein the at least one first gate electrode comprises at least one first metal portion forming the at least one first absorbent element, the at least one first metal portion having a thickness $E_p$ satisfying:

$$150\,\Omega \leq \frac{\rho}{Ep} \leq 700\,\Omega,$$

where $\rho$ is a resistivity of a metal material forming the at least one first metal portion.

2. The bolometer type detection structure according to claim 1, wherein the at least one first metal portion of the at least one first gate electrode is produced from a metal of the mid-gap type for the at least one third zone.

3. The bolometer type detection structure according to claim 2, wherein the at least one first metal portion is made from a metal chosen from among a group comprising titanium nitrides, tantalum nitrides, and molybdenum silicides, the at least one third zone being made of silicon.

4. The bolometer type detection structure according to claim 2, wherein the at least one first gate electrode is in short-circuit with one of the at least one first zone and the at least one second zone.

5. The bolometer type detection structure according to a claim 1, wherein the at least one first zone is surrounded by the at least one third zone, the at least one third zone being surrounded by the at least one second zone.

6. The bolometer type detection structure according to claim 1, wherein the MOSFET transistor further comprises:
   a fourth zone and a fifth zone, the fourth zone being of the first type of conductivity and the fifth zone being of the second type of conductivity chosen from among the group comprising the second type of conductivity opposite to the first type of conductivity and the type of conductivity in which the at least one third zone is substantially void of carriers, and
   a third gate electrode arranged to bias the fifth zone,
   wherein the fifth zone separates the at least one second zone and the fourth zone from one another, an assembly formed by the at least one third zone, the at least one second zone, and the fifth zone separating the at least one first zone and the fourth zone from one another, and
   wherein the third gate electrode comprises at least one second metal portion forming a second absorbent element, the at least one second metal portion having a thickness $E_p$ satisfying:

$$150\,\Omega \leq \frac{\rho}{Ep} \leq 700\,\Omega,$$

where $\rho$ is a resistivity of a metal material forming the at least one second metal portion.

7. The bolometer type detection structure according to claim 6,
   wherein the at least one first zone is surrounded by the at least one third zone, the at least one third zone being surrounded by the at least one second zone,
   wherein the fifth zone surrounds the at least one second zone, and
   wherein the fourth zone surrounds the fifth zone.

8. The bolometer type detection structure according to claim 1, wherein the at least one third zone is of the type of conductivity in which the at least one third zone is substantially void of carriers.

9. The bolometer type detection structure according to claim 1, wherein a reflection surface is provided, configured to form a quarter-wave cavity with the at least one first absorbent element.

10. The bolometer type detection structure according to claim 1, further comprising a reading circuit configured to bias the MOSFET transistor and to determine, from an operating current of the MOSFET transistor, the rise in temperature of the at least one first absorbent element,
wherein the reading circuit and the MOSFET transistor are separated from one another by at least a first insulating arm and a second insulating arm each comprising at least one conductive track configured to bias the MOSFET transistor.

11. The bolometer type detection structure according to claim 10, wherein each of the at least one conductive track of the first insulating arm and the second insulating arm is a metal track forming a third absorbent element and has a thickness $E_p$ satisfying:

$$150 \: \Omega \leq \frac{\rho}{Ep} \leq 700 \: \Omega,$$

where $\rho$ is a resistivity of a metal material forming a second metal portion.

12. The bolometer type detection structure according to claim 1,
wherein the MOSFET transistor further comprises a second gate electrode on a face of the MOSFET transistor that is opposite to the at least one first gate electrode, and
wherein the second gate electrode comprises at least one metal portion forming a fourth absorbent element.

13. A method for manufacturing a bolometer type detection structure, comprising the following steps:
providing at least one first zone, one second zone, and one third zone, the at least one first zone and the second zone being of a first type of conductivity, the third zone separating the at least one first zone and the second zone from one another, and the third zone being of a conductivity type selected from among a group comprising a second type of conductivity opposite to the first type of conductivity and a type of conductivity in which the third zone is substantially void of carriers;
forming a first gate electrode arranged to bias the third zone so as to form a MOSFET transistor, the first gate electrode comprising at least one first metal portion forming an absorbent element configured to absorb electromagnetic radiation, the MOSFET transistor being associated with the absorbent element to detect a rise in temperature of the absorbent element when the electromagnetic radiation is absorbed, the at least one first metal portion having a thickness $E_p$ satisfying:

$$150 \: \Omega \leq \frac{\rho}{Ep} \leq 700 \: \Omega,$$

where $\rho$ is a resistivity of a metal material forming the at least one first metal portion.

14. The method for manufacturing a bolometer type detection structure according to claim 13, wherein, during the step of forming the first gate electrode, the at least one first metal portion of the first gate electrode is produced from a metal of the mid-gap type for the third zone.

15. The method for manufacturing a bolometer type detection structure according to claim 14, wherein the at least one first metal portion is made from a metal chosen from among a group comprising titanium nitrides, tantalum nitrides, and molybdenum silicides, the third zone being made of silicon.

16. The method for manufacturing a bolometer type detection structure according to claim 13, further comprising the following steps:
forming a reading circuit configured to bias the MOSFET transistor and to determine, from an operating current of the MOSFET transistor, the rise in temperature of the absorbent element;
forming a first insulating arm and a second insulating arm each comprising at least one conductive track; and
associating together the MOSFET transistor, the first insulating arm and the second insulating arm, and the reading circuit, so that the reading circuit is electrically connected to the MOSFET transistor by means of the respective conductive tracks of the first insulating arm and the second insulating arm.

17. The method for manufacturing a bolometer type detection structure according to claim 16,
wherein, during the step of forming the reading circuit, a substep of forming a reflection surface is performed, and
wherein during the step of associating together the MOSFET transistor, the first insulating arm and the second insulating arm, and the reading circuit, the reflection surface has an arrangement so as to form a quarter-wave cavity with the at least one first metal portion made of the first gate electrode, the least one first metal portion being made from titanium nitride.

* * * * *